(12) United States Patent
Boitano

(10) Patent No.: US 7,432,707 B1
(45) Date of Patent: Oct. 7, 2008

(54) MAGNETIC RESONANCE IMAGING WITH CORRECTED INTENSITY INHOMOGENEITY

(75) Inventor: Michael Boitano, Smithtown, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 11/656,562

(22) Filed: Jan. 23, 2007

Related U.S. Application Data

(63) Continuation of application No. 11/452,415, filed on Jun. 14, 2006, now abandoned.

(51) Int. Cl.
*G01V 3/00* (2006.01)

(52) U.S. Cl. .................................. 324/309; 324/318

(58) Field of Classification Search .......... 324/300–322; 600/407–422
See application file for complete search history.

(56) References Cited

U.S. PATENT DOCUMENTS

| | | | | |
|---|---|---|---|---|
| 4,720,679 | A * | 1/1988 | Patrick et al. ................ | 324/309 |
| 5,600,244 | A | 2/1997 | Jensen et al. | |
| 5,671,264 | A * | 9/1997 | Florent et al. ................ | 378/98 |
| 5,827,942 | A * | 10/1998 | Madsen et al. ............... | 73/1.82 |
| 6,208,138 | B1 * | 3/2001 | Lai et al. ..................... | 324/307 |
| 2006/0182363 | A1 * | 8/2006 | Jellus ......................... | 382/254 |

OTHER PUBLICATIONS

B.R. Condon, et. al.; "Image non-uniformity in magnetic resonance imaging its magnitude and methods for its correction," *Br. J. Radiol.*, vol. 60, pp. 83-87, 1987.

S.E. Moyher, et al.; "Surface coil MR Imaging of the Human Brain with an Analytic Reception Profile Correction"; *JMRI*, vol. 5, pp. 139-144, 1995.

C.R. Meyer, et al.; "Retrospective corrections of intensity inhomogeneities in MRI," *IEEE Trans. Med. Imaging*, vol. 14, pp. 36-41, 1995.

B.M. Dawant, et al.; "Correction of Intensity Variations in MR Images for Computer-Aided Tissue Classification," *IEEE Trans. Med. Imag.*, vol. 12, pp. 770-781, 1993.

L. Axel, et al.; "Intensity Correction in Surface-Coil MR Imaging," *AJR*, vol. 148, pp. 418-420, 1987.

R.C. Gonzalez, et al.; "Digital Imaging Processing," *Second Edition, Addision Wesley*, pp. 144-158, 1987.

* cited by examiner

*Primary Examiner*—Brij B Shrivastav
(74) *Attorney, Agent, or Firm*—Winston & Strawn LLP; Raymond Van Dyke

(57) ABSTRACT

The present invention provides a method and apparatus to enhance the image contrast of a Magnetic Resonance Imaging (MRI) device while simultaneously compensating for image inhomogeneity, regardless of the source. The method makes no assumptions as to the source of the inhomogeneities, e.g., physical coil characteristics or patient placement. In the method, the error between the histogram of the spatially-weighted original image and a specified histogram is minimized. The specified histogram may be selected to increase tissue contrast generally or to accentuate a particular tissue class. The weighting is achieved by two-dimensional interpolation of a sparse grid of control points overlaying the image. The sparse grid is used rather than a dense one to compensate for the slowly varying image non-uniformity. Also, sparseness reduces the computational complexity as the final weight set involves the solution of simultaneous linear equations whose number is the size of the chosen grid.

23 Claims, 10 Drawing Sheets

MAGNETIC RESONANCE IMAGING WITH CORRECTED INTENSITY INHOMOGENEITY

This application is a Continuation application and claims the benefit of U.S. patent application Ser. No. 11/452,415 filed Jun. 14, 2006 now abandoned, the contents of which are incorporated herein by reference.

BACKGROUND OF THE PRESENT INVENTION

1. Technical Field

The technical field generally relates to magnetic resonance imaging and more specifically to a method for improving the image contrast of a magnetic resonance imaging apparatus.

2. Background

Magnetic resonance imaging (MRI), also called nuclear magnetic resonance imaging (NMR imaging), is a non-destructive method for the analysis of materials and is used extensively in medical imaging. It is generally non-invasive and does not involve ionizing radiation. In general terms, nuclear magnetic moments are excited at specific spin precession frequencies, which are proportional to an external main magnetic field. The radio frequency (RF) signals resulting from the precession of these spins are collected using receiver coils. By manipulating the magnetic fields, an array of signals is provided representing different regions of the volume under study. These signals are combined to produce a volumetric image which depends on the T1 and T2 values as well as the spin density.

In MRI, a body is subjected to a constant main magnetic field. Another magnetic field, in the form of electromagnetic RF pulses, is applied orthogonally to the constant magnetic field. The RF pulses have a particular frequency that is chosen to affect particular nuclei, typically hydrogen, in the body. The RF pulses excite the nuclei, increasing the energy state of the nuclei. After the pulse, the nuclei relax and release RF emissions, corresponding to the RF pulses, which are measured and processed into images for display.

When hydrogen nuclei relax, the frequency that they transmit is positively correlated with the strength of the magnetic field surrounding them. For example, a magnetic field gradient along the z-axis, called the "slice select gradient," is set up when the RF pulse is applied, and is shut off when the RF pulse is turned off. This gradient causes the hydrogen nuclei at the high end of the gradient, where the magnetic field is stronger, to precess at a high frequency, and those at the low end, where the magnetic field is weaker, to precess at a lower frequency. When the RF pulse in a narrow band is applied, only those nuclei which precess at that particular frequency will be tilted, to later relax and emit a radio transmission. That is, the nuclei "resonate" to that particular frequency. For example, if the magnetic gradient caused hydrogen nuclei to precess at rates from about 10.0 MHz at the low end of the gradient to about 10.05 MHz at the high end, and the gradient were set up such that the high end was located at the patient's head and the low end at the patient's feet, then a 10.0 MHz RF pulse would excite the hydrogen nuclei in a slice near the feet, and a 10.05 MHz pulse would excite the hydrogen nuclei in a slice near the head. When a single "slice" along the z-axis is selected, only the protons in this slice are excited by the specific RF pulse to a higher energy level, to later relax to a lower energy level and emit a radio frequency signal.

The second dimension of the image is extracted with the help of a phase-encoding gradient. Immediately after the RF pulse ceases, all of the nuclei in the activated higher energy level slice are in phase. Left to their own devices, these vectors would relax. In MRI, however, the phase-encoding gradient, in the y-dimension, is briefly applied in order to cause the magnetic vectors of nuclei along different portions of the gradient to have a different phase advance. Typically, the sequence of pulses is repeated to collect all the data necessary to produce an image. As the sequence of pulses is repeated, the strength of the phase-encoding gradient is stepped spirally, linearly, or in another fashion, as the number of repetitions progresses. That is, the phase-encoding gradient may be evenly incremented, where the distance between steps is constant, after each repetition. The number of repetitions of the pulse sequence is determined by the type of image desired and can be any integer, typically from 128 to 1024, although additional phase encoding steps are utilized in specialized imaging sequences.

After the RF pulse, slice select gradient, and phase-encoding gradient have been turned off, the MRI instrument sets up a third magnetic field gradient, along the x-axis, called the "frequency encoding gradient" or "read-out gradient." This gradient causes the relaxing protons to differentially precess, so that the nuclei near the lower end of the gradient begin to precess at a fast rate, and those at the higher end precess at a faster rate. Thus, when these nuclei relax, the fastest ones. i.e., those which were at the high end of the gradient, will emit the highest frequency RF signals. The frequency encoding gradient is applied only when the RF signals are to be measured.

While the z-axis was used as the slice-select axis in the above example, similarly, either the x-axis or y-axis may be set up as the slice-select axis depending upon the desired image orientation and the anatomical structure of the object of interest being scanned. For example, when a patient is laying supine in the main magnetic field, the x-axis is utilized as the slice-select axis to acquire sagittal images, and the y-axis is utilized as the slice-select axis to acquire coronal images. When the area of interest is at an angle to these three planes, different axes may be used to produce oblique imaging. The gradient axes, x, y, and z, may be chosen at an angle to the orthogonal planes by applying a function, usually sine or cosine, to the y and z axes.

Regardless of the orientation of the selected scan, mathematically, the slice select gradient, phase-encoding gradient, and read-out gradient are orthogonal. The result of the MRI scan in the true domain representation k-space is converted to image display data after a 2D or 3D Fast Fourier transform (FFT). Generally, in a transverse slice, the readout gradient is related to the $k_x$ axis and the phase-encoding gradient is related to the $k_y$ axis. In 3D MRI, an additional phase-encoding gradient is related to the $k_z$ axis to acquire data in a third dimension. When the number of phase-encoding levels is smaller than a binary number, the missing data may be filled with zeros to complete the k-space so that an FFT algorithm can be applied.

In k-space, data is arranged in an inhomogeneous distribution such that the data at the center of a k-space map contains low frequency spatial data, that is, the general spatial shape of an object being scanned. The data at the edges of the k-space map contains high frequency spatial data including the spatial edges and details of the object.

The problems associated with MRI image intensity inhomogeneity are well known. Images that exhibit this phenomenon show gradual, low frequency spatial variation in tissue class intensity. The sources of the problem include receiver coil, transmitter coil and magnetic field variations, uncompensated eddy currents, and patient positioning. Display presentation and automatic computer analysis, including tissue segmentation and classification, become problematic with such images.

The receiver coil may be the primary contributor to intensity variations. The spatial variation of the coil field produces images that have strong signal intensities near the coil surface and decreased intensity distant from the coil. Both conventional circumferential coils and, particularly, surface coil arrays may exhibit this problem. Additionally, transceiver coils may exhibit transmitter field and receiver field intensity variations which contribute to image inhomogeniety.

A simple mathematical model of the measured MR image is given by the following equation:

$$R(x,y)=F(x,y) \cdot I(x,y)$$

Where $R(x,y)$ is the received image, $F(x,y)$ is the multiplicative, inhomogeneous coil(s) field, and $I(x,y)$ is the unadulterated true image data. In this model random noise is ignored. If the coil field were known, the received image could be modified by $F^{-1}(x,y)$ producing the more uniform true image. Numerous methods to estimate the receiver coil field have been proposed. One class' of solutions involves knowledge of the coil geometry and electrical characteristics allowing analytic field modeling using the Biot-Savart law. These methods require knowledge of the patient position and size of the receiver coil and do not account for changing coil characteristics. Also, the flexible nature of coil arrays is problematic. Another class utilizes additional measurements on a uniform phantom to map the coil field. The requirement for identical patient and phantom scanning parameters make these techniques impractical. Other techniques use low resolution images acquired at the time of the patient scan to estimate the coil field, thus increasing the scan time. Post-processing or retrospective methods have been proposed also. Some require manual intervention to achieve good results, which is not desirable. Some assume that a low pass filtered version of the image is a good approximation to the coil field, which is not the case in high contrast areas of images. A number of other post-processing methods use image content to generate an estimate of the intensity field. Thus, a method is desired that compensates for image inhomogeneity regardless of the source while simultaneously enhancing the image contrast.

SUMMARY

The present invention provides a method and apparatus to enhance the image contrast of a Magnetic Resonance Imaging (MRI) device while simultaneously compensating for image inhomogeneity, regardless of the source. The present invention corrects intensity inhomogeneities producing a more uniform image appearance. Also, the image is enhanced through increased tissue contrast. The present invention makes no assumptions as to the source of the inhomogeneities, e.g., physical coil characteristics or patient placement. In the method, the error between the histogram of the spatially weighted original image and a specified histogram is minimized. The specified histogram may be selected to increase tissue contrast generally or to accentuate a particular tissue class. The weighting is achieved by two-dimensional interpolation of a sparse grid of control points overlaying the image. The sparse grid is used rather than a dense one to compensate for the slowly varying image non-uniformity. Also, sparseness reduces the computational complexity as the final weight set involves the solution of simultaneous linear equations whose number is the size of the chosen grid.

BRIEF DESCRIPTION OF THE DRAWINGS

The features, aspects, and advantages of the present invention will become better understood with regard to the following description, appended claims, and accompanying Drawings where:

DETAILED DESCRIPTION OF THE INVENTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

The present invention is a magnetic resonance imaging method and apparatus that transforms the original pixel values of an image so that the resulting image histogram approximates a specified histogram with certain spatial constraints. Histogram modification has been used as an image enhancement technique for some time. By modifying the histogram as described below, the method compensates for image inhomogeneity regardless of the source, while simultaneously enhancing the image contrast. The present invention will be described in more detail herein below.

Figure 1A:
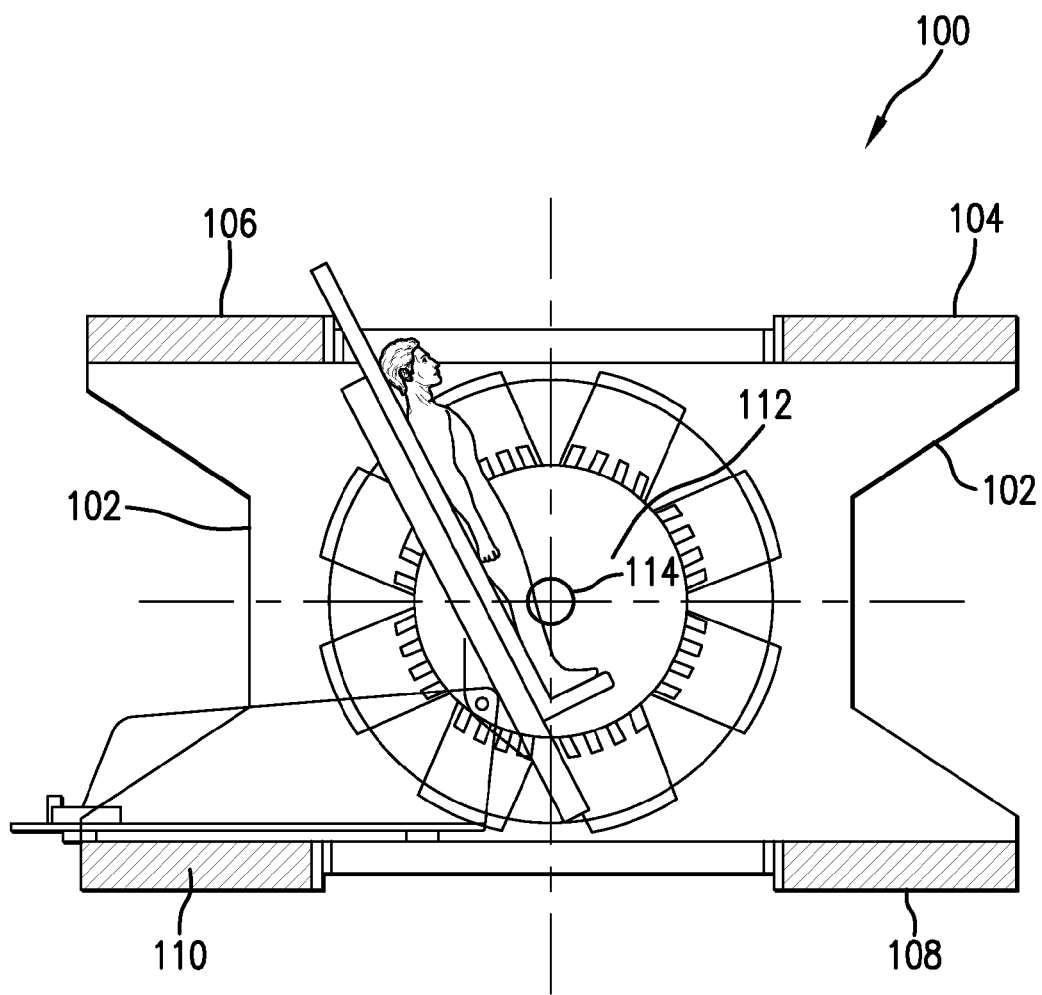
FIGS. 1A and 1B generally illustrate an MRI apparatus that employs the principles of the present invention.
Figure 1B:
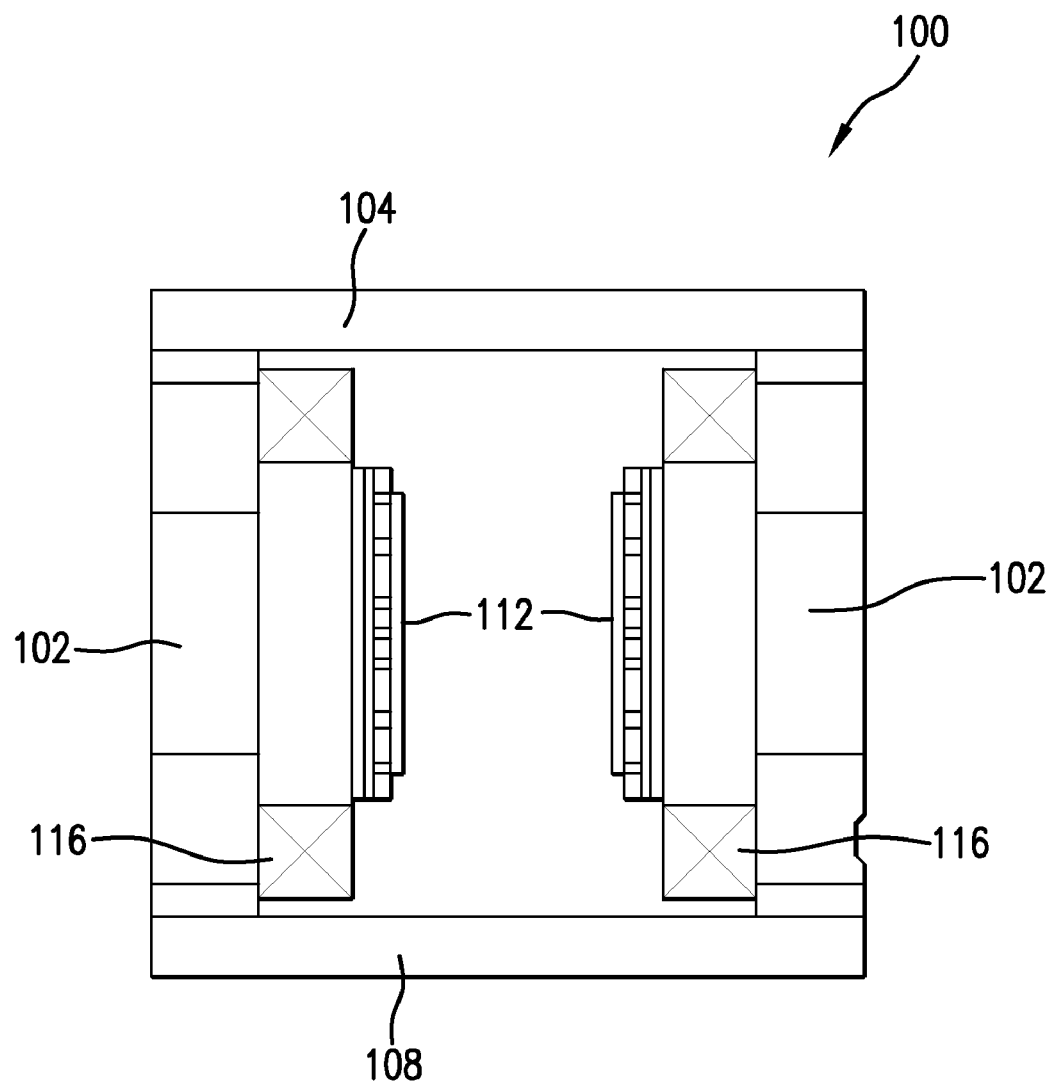

An exemplary MRI apparatus of the present invention, with which the principles of the present invention may be practiced, is shown in FIGS. 1A and 1B of the Drawings. In an open MRI, generally represented by the reference numeral 100 in FIGS. 1A and 1B, a magnet structure includes a pair of vertically extending sidewalls 102 and an upper flux return structure, including a pair of flux return members 104 and 106 extending between sidewalls 102. The lower flux return structure includes a similar pair of flux return members 108 and 110. A pair of round, generally cylindrical ferromagnetic poles 112 project inwardly from the opposed sidewalls 102 along a magnet axis or pole axis 114. A flux source is also provided, in this example including coils 116, illustrated in FIG. 1B, which may be resistive or super-conducting coils surrounding the poles or may be permanent magnet material, as is understood in the art. In a possible variant, the upper and lower flux return members, 104, 106, 108 and 110 may not necessarily include pairs, as is described hereinabove. In particular the upper and lower flux return members may include a single member that is positioned and sized to provide an adequate flux return path.

A more detailed description of the exemplary MRI apparatus may be found in commonly-owned U.S. Pat. No. 6,828, 792, which is incorporated by reference herein. Although the MRI apparatus described in this specification is preferably an open MRI apparatus, or other non-traditional MRI apparatus, the principles of the present innovation are just as applicable for any traditional MRI apparatus as well.

Figure 2:
FIG. 2 illustrates a sagittal lumbar spine T1 fast spin echo image with intensity variations.
Figure 3:
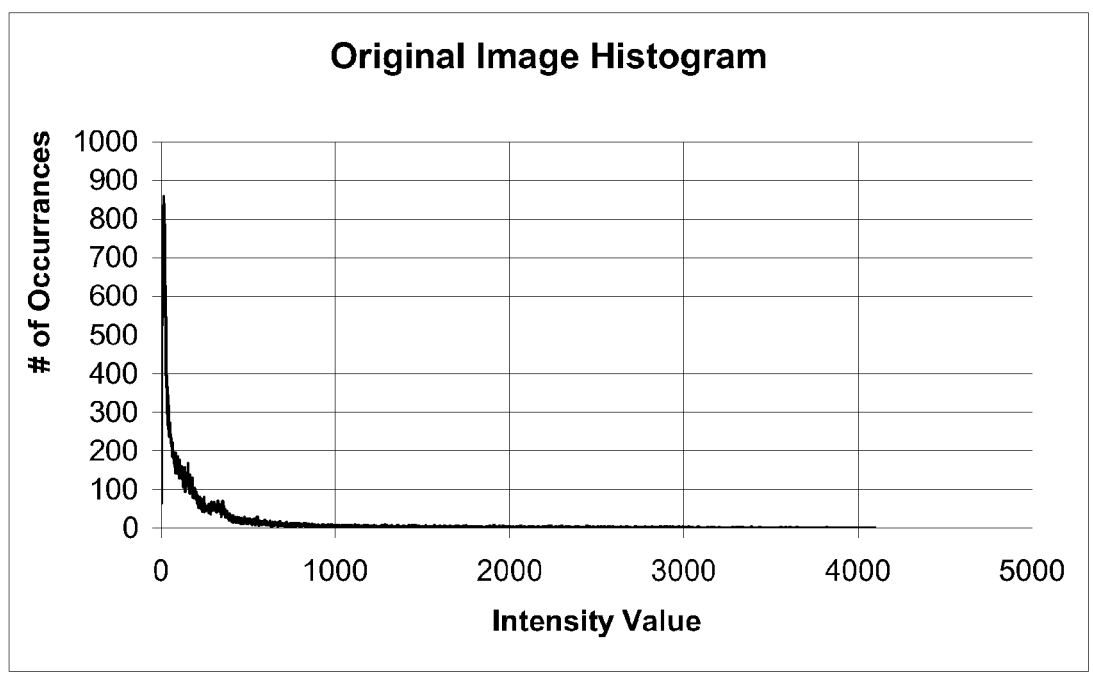
FIG. 3 shows a histogram for the image of FIG. 2.

In an MR image, intensity inhomogeneity degrades image contrast, thereby making presentation problematic regardless of contrast and brightness settings. An example of an image with undesirable intensity variations is shown in FIG. 2. The image of FIG. 2 is from an MRI apparatus, such as that of FIGS. 1A and 1B, and shows a sagittal lumbar spine T1 fast spin echo image. Areas of the image near the receiver coil are extremely bright with intensity decreasing with anterior distance. The histogram of this image is shown in FIG. 3. The dominance of the dark pixel areas is noted with the great majority of pixels below intensity values of 1000.

Figure 4:
FIG. 4 illustrates a uniform histogram equalized image of the image of FIG. 2.
Figure 5:
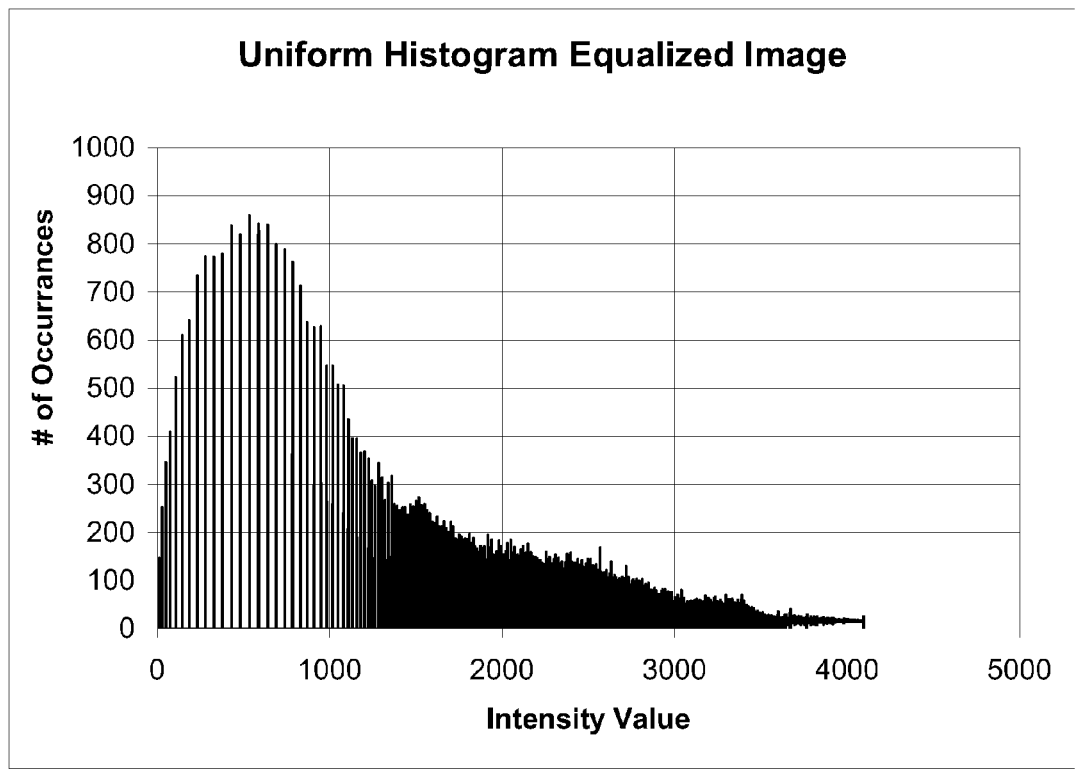
FIG. 5 shows a uniform histogram for the image of FIG. 4, weighted to brighter values.

After processing the image according to traditional uniform histogram equalization, the image is more uniform in intensity, but still somewhat difficult to analyze, as is shown in FIG. 4. The modified histogram of this image is shown in FIG. 5. As can be seen from FIGS. 4 and 5, the histogram is more uniformly distributed and the resulting image is more uniform in appearance, albeit not demonstrably better than the original.

In the traditional method of direct histogram specification, the histogram is modified in a manner that depends solely on the global properties of the image, i.e., the histogram. This traditional technique transforms the image histogram to a specified histogram without regard to local image content. Two distinct images with identical histograms will, therefore, generate the same transformation.

Although this is a standard method of image enhancement, it is not entirely appropriate for the aforedescribed image inhomogeneity problem. A "dark" pixel in the relatively bright portion of an MR image should not be transformed in the same way as a "dark" pixel in an area of decreased intensity. To remedy this problem, the present invention introduces the effects of the slowly varying intensity inhomogeneity into the generation of individual pixel transformations.

Before correction, near the surface of the receiver coil, image intensity is bright, while image intensity drops off moving away from the coil. When corrected using the correction technique of the present invention, the intensity near the coil is decreased while the intensity away from the coil is increased. This technique makes the image intensity more uniform, and decreases image contrast globally, but increases contrast within tissue classes. Following correction, images of the spine and images of tissue classes with fat have greater contrast. Prior to correction, areas with high intensity, such as subcutaneous fat, bright areas near the skin, bright areas near the coil distort the image and make diagnosis difficult. After processing, the global image contrast is decreased, and the intensity of the fat values are decreased, but dark areas in fat are increased and contrast within tissue classes is increased.

In the present invention, a specified histogram distribution is selected to enhance the image in some way. Uniform or linearly-rising histograms have been used to increase the contrast in dark image areas, but any other shape may be used. A transformation is then applied to the original image gray levels modifying them to have the specified histogram. These are the reference pixel set. A sparse rectangular grid of control points is overlaid on the image. This grid represents the location of a group of interpolating functions that influence each pixel's final value depending on the Euclidean distance of the pixel from the control or grid point. A sparse grid is chosen rather than a dense one to compensate for the slowly varying image inhomogeneity. A dense grid would introduce the capability to correct for high frequency changes in image intensity, which is not necessarily desirable. The method of the present invention computes a set of weights that scale the amplitudes of the interpolating functions. The weights are computed in such a way as to minimize the sum of the squared errors between the histogram-transformed pixel value and the weighted pixel value. Grid sparseness reduces the computational complexity as the final weight set involves the solution of simultaneous linear equations whose number is the size of the chosen grid.

The global histogram specification transformation is computed in the conventional manner:

$$s_n = T(G_n)$$

where n is the gray level index, $S_n$ is the gray level result after transforming gray level value $G_n$, and $T(\cdot)$ is the histogram specified transformation.

The square of the total image error is given by:

$$\varepsilon^2 = \sum_{i=1}^{N} \varepsilon_i^2 = \sum_{i=1}^{N} (s_i - s_i')^2$$

where $\varepsilon_i^2$ is the squared error associated with the $i^{th}$ pixel, N is the number of pixels in the image, and $s_i$ is the histogram-specified transformed gray level of the $i^{th}$ pixel. The term $s_i'$ is the resulting gray level of the $i^{th}$ pixel due to the total contribution of the interpolated weighting grid. Thus, $$s_i' = P_i \sum_{j=1}^{M} b_{ji} W_j$$

where $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, i.e., grid point, and M is the number of points in the grid. That is, the new gray level value of the $i^{th}$ pixel is the old gray value times the sum of the M interpolation function contributions. Two dimensional interpolation functions have been studied, and multiquadratic basis functions are chosen for their smoothness and accuracy. In that case, the equation used is $b_{ji} = \sqrt{(d_{ji}^2 + r^2)}$, where r is an adjustable parameter, and $d_{ji}$ is the Euclidean distance from the $j^{th}$ grid point to the $i^{th}$ pixel. Other functions such as $b_{ji} = d_{ji}^2 \log d_{ji}$ or two dimensional Gaussian functions may be used for simplicity.

The total squared error then becomes:

$$\varepsilon^2 = \sum_{i=1}^{N} \left[ s_i - P_i \sum_{j=1}^{M} b_{ji} W_j \right]^2$$

Taking the partial derivative with respect to the weights and equating to zero minimizes the error, yielding:

$$\frac{\partial \varepsilon^2}{\partial W_k} = 2 \sum_{i=1}^{N} \left[ s_i - P_i \sum_{j=1}^{M} b_{ji} W_j \right] \cdot [-P_i b_{ki}] = 0$$

$$\sum_{i=1}^{N} P_i^2 b_{ki} \sum_{j=1}^{M} b_{ji} W_j = \sum_{i=1}^{N} s_i P_i b_{ki}$$

This may be rewritten in matrix form as $$\begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix} \begin{bmatrix} W_1 \\ W_2 \\ \vdots \\ W_M \end{bmatrix} =$$

$$\begin{bmatrix} \sum_{i=1}^{N} s_i P_i b_{1i} \\ \sum_{i=1}^{N} s_i P_i b_{2i} \\ \sum_{i=1}^{N} s_i P_i b_{Mi} \end{bmatrix}$$

$BW = Z$

B is a symmetric and positive definite matrix and the set of weights can now be solved by the inversion of B.

$$W = B^{-1} Z$$

Figure 6:
FIG. 6 illustrates an image processed according to the present invention.
Figure 7:
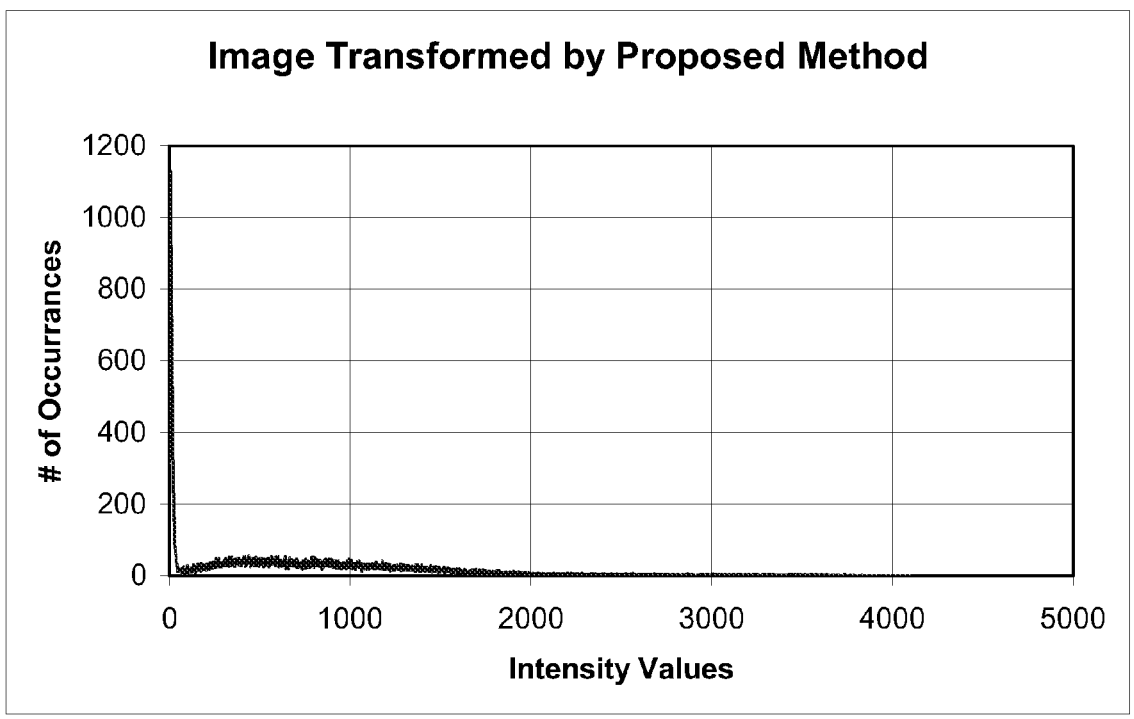
FIG. 7 shows a histogram, according to the present invention, for the image of FIG. 6.

The image of FIG. 2 was processed with the technique described hereinabove and the resulting image is shown in FIG. 6. As is evident from the figure, the image has been transformed to a more uniform intensity. Unlike the traditional histogram equalization technique, this method considers a pixel's location when performing modification. The resulting histogram is shown in FIG. 7. The histogram still shows a large number of pixels near zero intensity representing those in the image outside the anatomy. However, there has been a shift in anatomy pixels toward brighter values.

The image of FIG. 6 was processed using two-dimensional Gaussian weighting functions centered on a 4×4 grid. That is, 16 grid points were chosen to overlay the original image information of FIG. 2. At each grid point, the interpolation function or weighting function used was a two-dimensional Gaussian function. Alternatively, for a 3D MR image, the interpolation function or weighting function used at each 3D grid point could be a three-dimensional Gaussian function. Each weighting function at each grid point varies in amplitude, thereby correcting the original image for intensity inhomogeneities.

Figure 8:
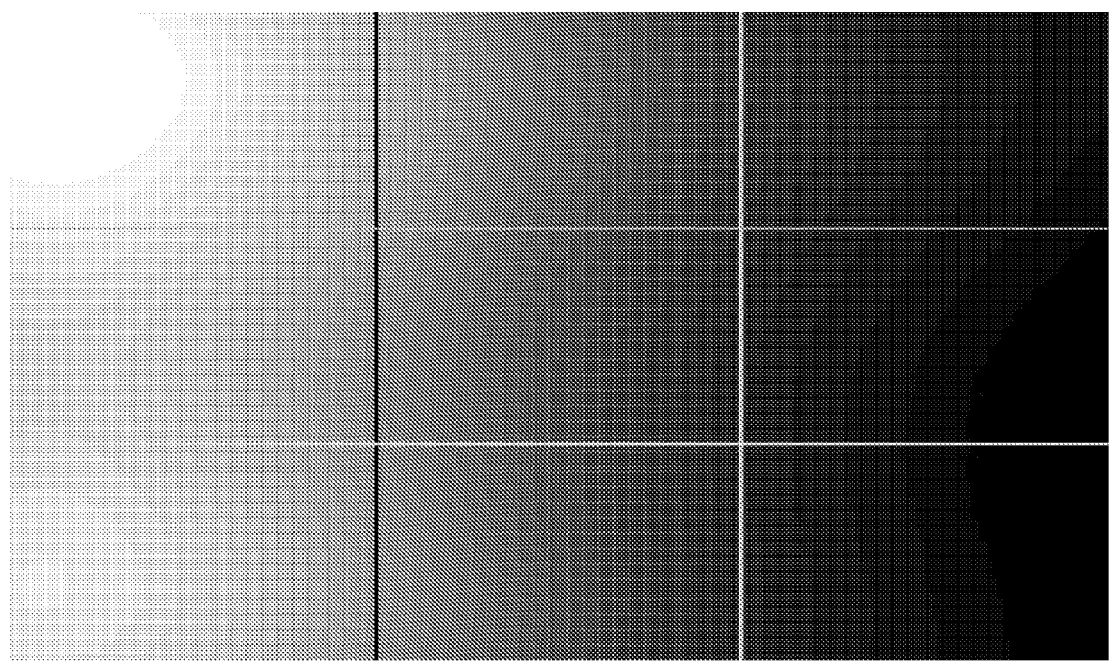
FIG. 8 shows the weighting function surface of the present invention.

The total weight contribution to the image of these functions is shown in FIG. 8. The brighter intensity areas in FIG. 8 represent the higher weighting values. The weighting surface appears to be the inverse of the coil intensity profile in the original image. The weighting functions are centered at the intersection of the gridlines, i.e., the intersections of horizontal and vertical lines connecting the 16 grid points, along the image perimeter as well as with each other.

The method described hereinabove corrects intensity inhomogeneities producing a more uniform image appearance. Also, the image is enhanced through increased tissue contrast. The method makes no assumptions as to the source of the inhomogeneities, e.g., physical coil characteristics or patient placement. In the method, the error between the histogram of the spatially-weighted original image and a specified histogram is minimized. The specified histogram may be selected to increase tissue contrast generally or to accentuate a particular tissue class. The weighting is achieved by two-dimensional interpolation of a sparse grid of control points overlaying the image. The sparse grid is used rather than a dense one to compensate for the slowly varying image non-uniformity. Also, sparseness reduces the computational complexity as the final weight set involves the solution of simultaneous linear equations whose number is the size of the chosen grid.

Figure 9:
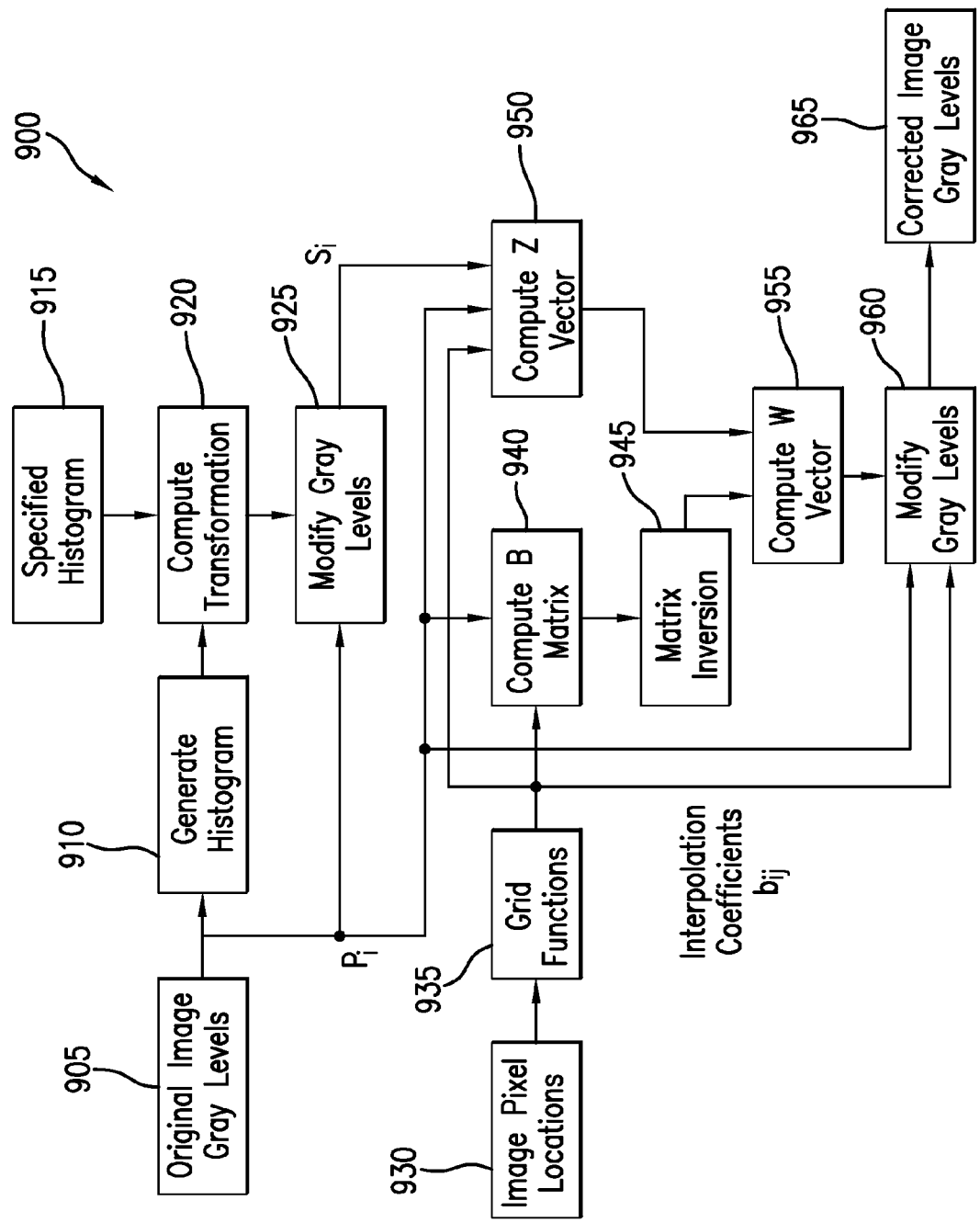
FIG. 9 illustrates a flow chart of steps employed in implementing an embodiment of the present invention.

With reference now to FIG. 9, there is shown a flowchart, designated generally by the reference numeral 900, illustrating various steps that may be performed in implementing the present invention. In FIG. 9, original image gray levels, i.e., the raw image data or $P_i$, designated by the reference numeral 905, such as shown hereinabove in FIG. 2, are used to generate an original image histogram 910, such as shown in FIG. 3. Also shown in FIG. 9 is a specified histogram 915, e.g., the aforementioned uniform, linearly-rising or other histograms. A transformation 920 is then applied to the original gray levels 905, using the original image histogram 910, modifying the levels to have the specified histogram 915, resulting in modified image gray levels 925.

Also shown in flowchart 900 of FIG. 9 is an image pixel location element, designated by the reference number 930, which provides input to the aforedescribed grid, particularly a sparse rectangular grid of control points, overlaid on the image. As described hereinabove, the grid incorporates interpolation functions, designated generally by the reference numeral 935, which are used in the matrix calculations, as described hereinabove.

The original image gray levels ($P_i$) 905 and the grid functions 935 are used to compute the aforedescribed B matrix, designated by the reference numeral 940, which is then inverted 945. The original image gray levels 905, grid interpolation coefficients/functions 935 and the modified or transformed image gray levels 925 are employed to compute the aforementioned Z vector, designated by reference numeral 950. The inverted B matrix 945 and Z vector 950 are then used to compute the weight vector W, designated by reference numeral 955, as per the aforedescribed formula:

$$W = B^{-1} Z.$$

The original image gray levels 905, the grid functions 935 and the weight vector W 955 are then employed to modify the original data, designated by reference numeral 960, and output corrected image gray levels 965, pursuant to the teachings of the present invention.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A method of correcting intensity inhomogeneity in a magnetic resonance imaging machine, said method comprising the steps of:
   scanning an object using said magnetic resonance imaging machine;
   receiving pixel information for an image of the object;
   generating a histogram; and
   transforming at least one pixel in said pixel information by minimizing error between said histogram and a specified histogram.

2. The method of claim 1, wherein the step of transforming is performed by weighting said at least one pixel according to a weighting function.

3. The method according to claim 1, wherein said step of transforming comprises:
   modifying said pixel information;
   computing a weighting vector by minimizing the error between said histogram and said specified histogram; and
   correcting said pixel information using said weighting vector.

4. The method according to claim 3, wherein said weighting vector (W) is described by the formula:

$W = B^{-1} Z.$

5. The method according to claim 4, wherein the matrices B and Z are described by the formulas:

$$B = \begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix} \text{ and}$$

$$Z = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

where $s_i$ is the histogram specified transformed gray level of the $i^{th}$ pixel, N is the number of pixels in the image, $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, and M is the number of points in the grid.

6. The method according to claim 3, wherein said step of computing further comprises:
   applying to said pixel information a plurality of grid points, said grid points overlaying said image of said object, each said grid point having associated therewith at least one interpolating function.

7. The method according to claim 6, wherein said at least one interpolating function is selected from the group consisting of:
   Gaussian functions and multiquadratic basis functions.

8. The method according to claim 7, wherein said Gaussian function is selected from the group consisting of:
   two-dimensional Gaussian functions and three-dimensional Gaussian functions.

9. The method according to claim 1, wherein said specified histogram is selected from the group consisting of
   uniform histograms, linearly-rising histograms, tissue contrast enhancement histograms, tissue class accentuation histograms and combinations thereof.

10. A magnetic resonance imaging apparatus for imaging an object, said apparatus comprising:
    a magnetic field generator;
    a radio frequency signal generator, said radio frequency signal generator exciting respective nuclei within said object;
    a radio frequency coil for receiving magnetic resonance signals; and
    a processor for processing the magnetic resonance signals acquired,
    wherein said processor transforms image pixel information by minimizing error between a histogram of an image and a specified histogram.

11. The magnetic resonance apparatus according to claim 10, wherein said processor transforms image pixel information by weighting each pixel according to a weighting function.

12. The magnetic resonance apparatus according to claim 10, wherein said processor in transforming:
    modifies said pixel information;
    computes a weighting vector by minimizing the error between said histogram and said specified histogram; and
    corrects said pixel information using said weighting vector.

13. The magnetic resonance apparatus according to claim 12, wherein said weighting vector (W) is described by the formula:

$W = B^{-1} Z.$

14. The magnetic resonance apparatus according to claim 13, wherein the matrices B and Z are described by the formulas:

$$B = \begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix} \text{ and}$$

$$Z = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

where $s_i$ is the histogram specified transformed gray level of the $i^{th}$ pixel, N is the number of pixels in the image, $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, and M is the number of points in the grid.

15. The magnetic resonance apparatus according to claim 12, wherein said processor in computing:
applies to said pixel information a plurality of grid points, said grid points overlaying said image, each said grid point having associated therewith at least one interpolating function.

16. The magnetic resonance apparatus according to claim 15, wherein said at least one interpolating function is selected from the group consisting of:
Gaussian functions and multiquadratic basis functions.

17. The magnetic resonance apparatus according to claim 16, wherein said Gaussian function is selected from the group consisting of:
two-dimensional Gaussian functions and three-dimensional Gaussian functions.

18. The magnetic resonance apparatus according to claim 10, wherein said specified histogram is selected from the group consisting of:
uniform histograms, linearly-rising histograms, tissue contrast enhancement histograms, tissue class accentuation histograms and combinations thereof.

19. An image from a magnetic resonance imaging machine, said
image comprising: a plurality of pixels in an image,
wherein said plurality of pixels in said image correspond to pixel information of an object scanned by said magnetic resonance imaging machine, said pixel information having image intensity inhomogeneity therein; and
wherein at least one pixel in said pixel information is transformed by minimizing error between a histogram generated from said pixel information and a specified histogram, thereby correcting said image intensity inhomogeneity within said image, and forming a corrected image.

20. The image according to claim 19, wherein said at least one pixel is transformed by weighting said at least one pixel according to a weighing function.

21. A method of correcting intensity inhomogeneity in a magnetic resonance imaging machine, said method comprising the steps of:
scanning an object using said magnetic resonance imaging machine;
receiving pixel information for an image of the object;
generating a histogram of said image; and
transforming at least one pixel in said pixel information by minimizing error between said histogram and a specified histogram,
wherein a plurality of grid points overlay said image of said object, each said grid point having associated therewith at least one interpolating function, thereby minimizing said error.

22. A magnetic resonance imaging apparatus for imaging an object, said apparatus comprising:
a magnetic field generator;
a radio frequency signal generator, said radio frequency signal generator exciting respective nuclei within said object;
a radio frequency coil for receiving magnetic resonance signals; and
a processor for processing the magnetic resonance signals acquired,
wherein said processor transforms image pixel information by minimizing error between a histogram of an image and a specified histogram, and
wherein a plurality of grid points overlay said image, each said grid point having associated therewith at least one interpolating function, thereby minimizing said error.

23. An image from a magnetic resonance imaging machine, said image comprising:
a plurality of pixels in an image,
wherein said plurality of pixels in said image correspond to pixel information of an object scanned by said magnetic resonance imaging machine, said pixel information having image intensity inhomogeneity therein; and
wherein at least one pixel in said pixel information is transformed by minimizing error between a histogram generated from said pixel information and a specified histogram, and
wherein a plurality of grid points overlay said image, each said grid point having associated therewith at least one interpolating function, thereby correcting said image intensity inhomogeneity within said image, minimizing said error and forming a corrected image.

* * * * *